(12) United States Patent
Kim et al.

(10) Patent No.: US 11,637,121 B2
(45) Date of Patent: Apr. 25, 2023

(54) THREE-DIMENSIONAL (3D) SEMICONDUCTOR MEMORY DEVICE

(71) Applicant: Samsung Electronics Co., Ltd., Suwon-si (KR)

(72) Inventors: Junhyoung Kim, Seoul (KR); Geunwon Lim, Yongin-si (KR); Manjoong Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 60 days.

(21) Appl. No.: 16/802,736

(22) Filed: Feb. 27, 2020

(65) Prior Publication Data
US 2021/0020656 A1  Jan. 21, 2021

(30) Foreign Application Priority Data
Jul. 15, 2019 (KR) ........................ 10-2019-0085270

(51) Int. Cl.
| | | |
|---|---|---|
| *H01L 27/11519* | (2017.01) | |
| *H01L 27/11582* | (2017.01) | |
| *H01L 27/11565* | (2017.01) | |
| *H01L 27/11556* | (2017.01) | |
| *H01L 27/11524* | (2017.01) | |
| *H01L 27/1157* | (2017.01) | |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11565; H01L 27/11519; H01L 27/11582
See application file for complete search history.

(56) References Cited

U.S. PATENT DOCUMENTS

| | | | |
|---|---|---|---|
| 8,436,414 B2 | 5/2013 | Tanaka et al. | |
| 8,743,612 B2 | 6/2014 | Choi et al. | |
| 8,865,535 B2 | 10/2014 | Rabkin et al. | |
| 9,455,267 B2 | 9/2016 | Zhang et al. | |
| 9,728,548 B2 | 8/2017 | Freeman et al. | |
| 9,917,093 B2 | 3/2018 | Chu et al. | |
| 2016/0027730 A1* | 1/2016 | Lee ................... | H01L 27/11565 257/774 |
| 2017/0256551 A1* | 9/2017 | Lee ...................... | H01L 27/1157 |
| 2018/0181695 A1* | 6/2018 | Kim ........................ | H01L 23/48 |
| 2018/0182775 A1* | 6/2018 | Kim .................... | H01L 23/5226 |
| 2019/0043872 A1* | 2/2019 | Oh ...................... | G11C 16/0483 |

(Continued)

*Primary Examiner* — Sarah K Salerno
(74) *Attorney, Agent, or Firm* — Harness, Dickey & Pierce, P.L.C.

(57) ABSTRACT

A three-dimensional semiconductor memory device includes a substrate including a first connection region and a second connection region in a first direction and a cell array region between the first and second connection regions, and a first block structure on the substrate. The first block structure has a first width on the cell array region, the first block structure has a second width on the first connection region, and the first block structure has a third width on the second connection region. The first, second and third widths are parallel to a second direction intersecting the first direction, and the first width is less than the second width and is greater than the third width.

20 Claims, 19 Drawing Sheets

(56) References Cited

U.S. PATENT DOCUMENTS

2019/0355737 A1* 11/2019 Lee .................. H01L 27/11524
2019/0393241 A1* 12/2019 Baek ................ H01L 27/11565
2020/0227434 A1* 7/2020 Lee .................. H01L 27/11526

* cited by examiner

THREE-DIMENSIONAL (3D) SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2019-0085270, filed on Jul. 15, 2019, in the Korean Intellectual Property Office, the disclosure of which is hereby incorporated by reference in its entirety.

BACKGROUND

Embodiments of the inventive concepts relate to a three-dimensional (3D) semiconductor device and, more particularly, to a 3D semiconductor memory device with improved integration density.

Semiconductor devices have been highly integrated to provide excellent performance and low manufacturing costs. The integration density of semiconductor devices directly affects the costs of the semiconductor devices, thereby resulting in a demand of highly integrated semiconductor devices. The integration density of typical two-dimensional (2D) or planar semiconductor devices may be mainly determined by an area where a unit memory cell occupies. Therefore, the integration density of the typical 2D or planar semiconductor devices may be affected by a technique of forming fine patterns. However, since higher-priced apparatuses are needed to form fine patterns, the integration density of 2D semiconductor devices continues to increase, but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide a three-dimensional (3D) semiconductor memory device configured to improve and/or capable of improving integration density.

In an aspect, a 3D semiconductor memory device may include a substrate including a first connection region and a second connection region arranged in a first direction and a cell array region between the first and second connection regions, and a first block structure on the substrate. The first block structure may have a first width on the cell array region, the first block structure may have a second width on the first connection region, and the first block structure may have a third width on the second connection region. The first width, the second width and the third width may be parallel to a second direction intersecting the first direction, and the first width may be less than the second width and may be greater than the third width.

In another aspect, a 3D semiconductor memory device may include a first block structure, a second block structure and a third block structure, which are on a substrate and are spaced apart from each other in a first direction, a first block separation region separating the first block structure and the second block structure from each other, and a second block separation region separating the second block structure and the third block structure from each other. The first block separation region may be spaced apart from the second block separation region, and at least one of the first block separation region or the second block separation region may have a staircase shape when viewed in a plan view.

In still another aspect, a 3D semiconductor memory device may include a substrate including a first connection region and a second connection region in a first direction and a cell array region between the first and second connection regions, and a first block structure on the substrate. The first block structure may include a first lower electrode at a lowermost position, and first upper electrodes at an uppermost position. The first upper electrodes may be spaced apart from each other in a second direction intersecting the first direction and may have line shapes extending in the first direction. Each of the first upper electrodes may have a first width parallel to the second direction. The first lower electrode may include a protrusion laterally protruding from a sidewall of an outermost one of the first upper electrodes on one of the first and second connection regions. The protrusion may have a second width parallel to the second direction. The second width may range from one to three times the first width.

In still another aspect, a 3D semiconductor memory device may include a substrate including a first connection region and a second connection region in a first direction and a cell array region between the first and second connection regions, and a first block structure and a second block structure on the substrate and are spaced apart from each other by a block separation region in a second direction intersecting the first direction. The block separation region may have a stepped shape, a diagonal shape, or a staircase shape on one of the first and second connection regions when viewed in a plan view.

BRIEF DESCRIPTION OF THE DRAWINGS

The inventive concepts will become more apparent in view of the attached drawings and accompanying detailed description.

DETAILED DESCRIPTION OF EMBODIMENTS

Hereinafter, embodiments of the inventive concepts will be described in more detail with reference to the accompanying drawings.

Figure 1:
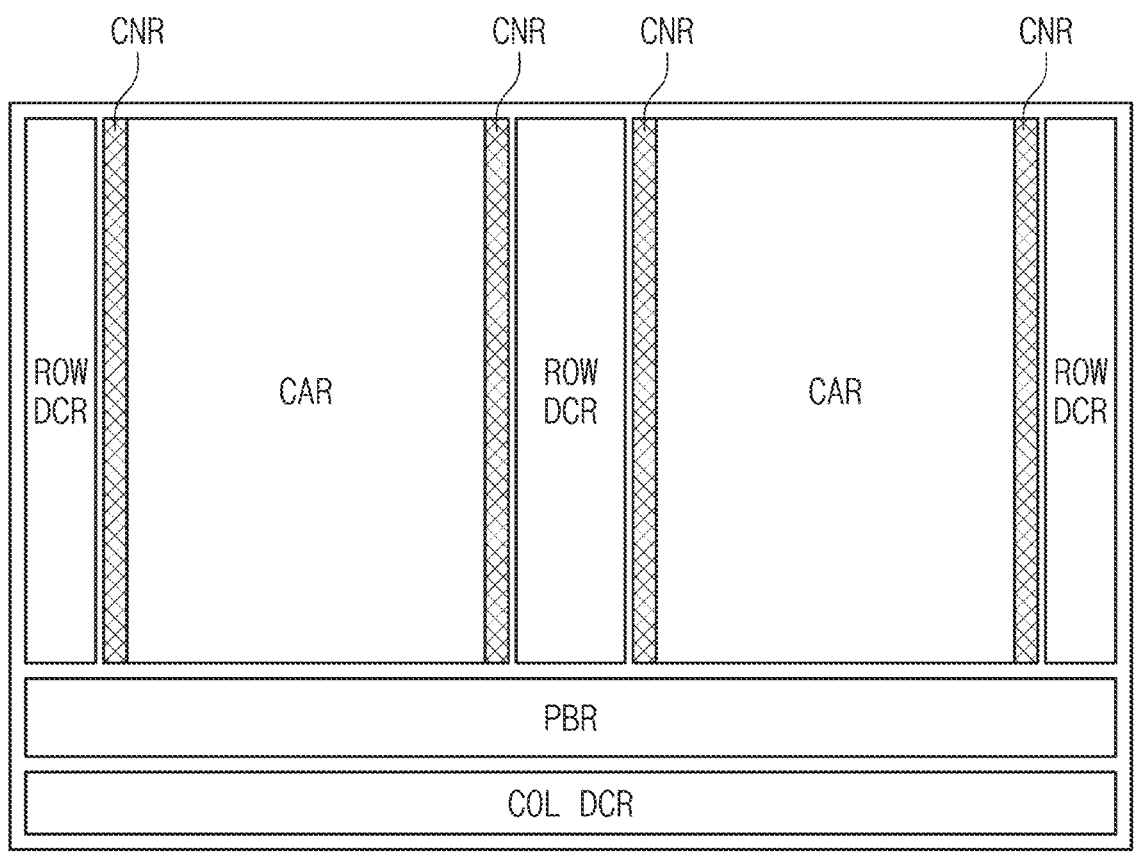
FIG. 1 is a schematic view illustrating a three-dimensional (3D) semiconductor memory device according to some embodiments of the inventive concepts.

FIG. 1 is a schematic view illustrating a three-dimensional (3D) semiconductor memory device according to some embodiments of the inventive concepts.

Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and/or a control circuit region (not shown). In some embodiments, a connection region CNR may be disposed between the cell array region CAR and the row decoder region ROW DCR.

A memory cell array including a plurality of memory cells may be disposed in the cell array region CAR. In some embodiments, the memory cell array may include three-dimensionally arranged memory cells, word lines, and/or bit lines. The word lines and the bit lines may be electrically connected to the memory cells.

A row decoder for selecting the word lines of the memory cell array may be disposed in the row decoder region ROW DCR, and an interconnection structure may be disposed in the connection region CNR. The interconnection structure may include contact plugs and interconnection lines, which electrically connect the memory cell array to the row decoder. The row decoder may select one among the word lines of the memory cell array in response to an address signal. The row decoder may provide a first word line voltage and second word line voltages to the selected word line and unselected word lines, respectively, in response to a control signal of a control circuit.

A page buffer for sensing data stored in the memory cells may be disposed in the page buffer region PBR. According to an operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
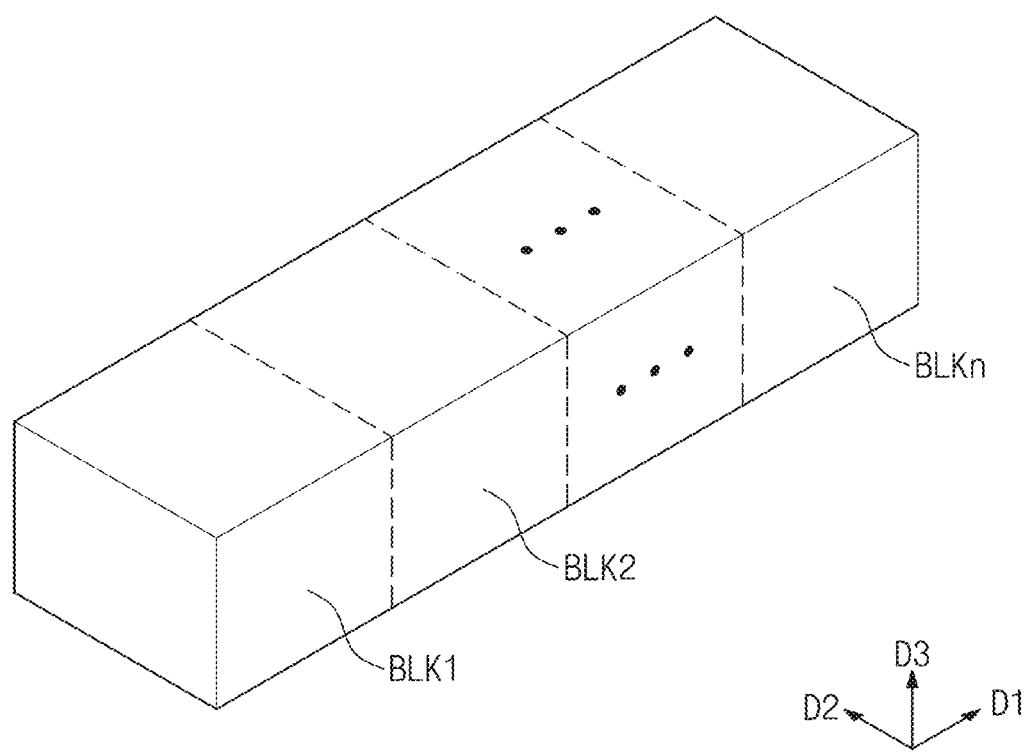
FIG. 2 is a schematic block diagram illustrating a cell array of a 3D semiconductor memory device according to some embodiments of the inventive concepts.

FIG. 2 is a schematic block diagram illustrating a cell array of a 3D semiconductor memory device according to some embodiments of the inventive concepts.

Referring to FIG. 2, the cell array region CAR may include a plurality of cell array blocks BLK1 to BLKn. Each of the cell array blocks BLK1 to BLKn may include an electrode structure that includes electrodes stacked on a plane, defined by first and second directions D1 and D2 intersecting each other, along a third direction D3. The electrode structure may be coupled to a plurality of vertical structures (e.g., semiconductor pillars) to constitute memory cells three-dimensionally arranged. In addition, each of the cell array blocks BLK1 to BLKn may further include bit lines electrically connected to the memory cells.

Figure 3:
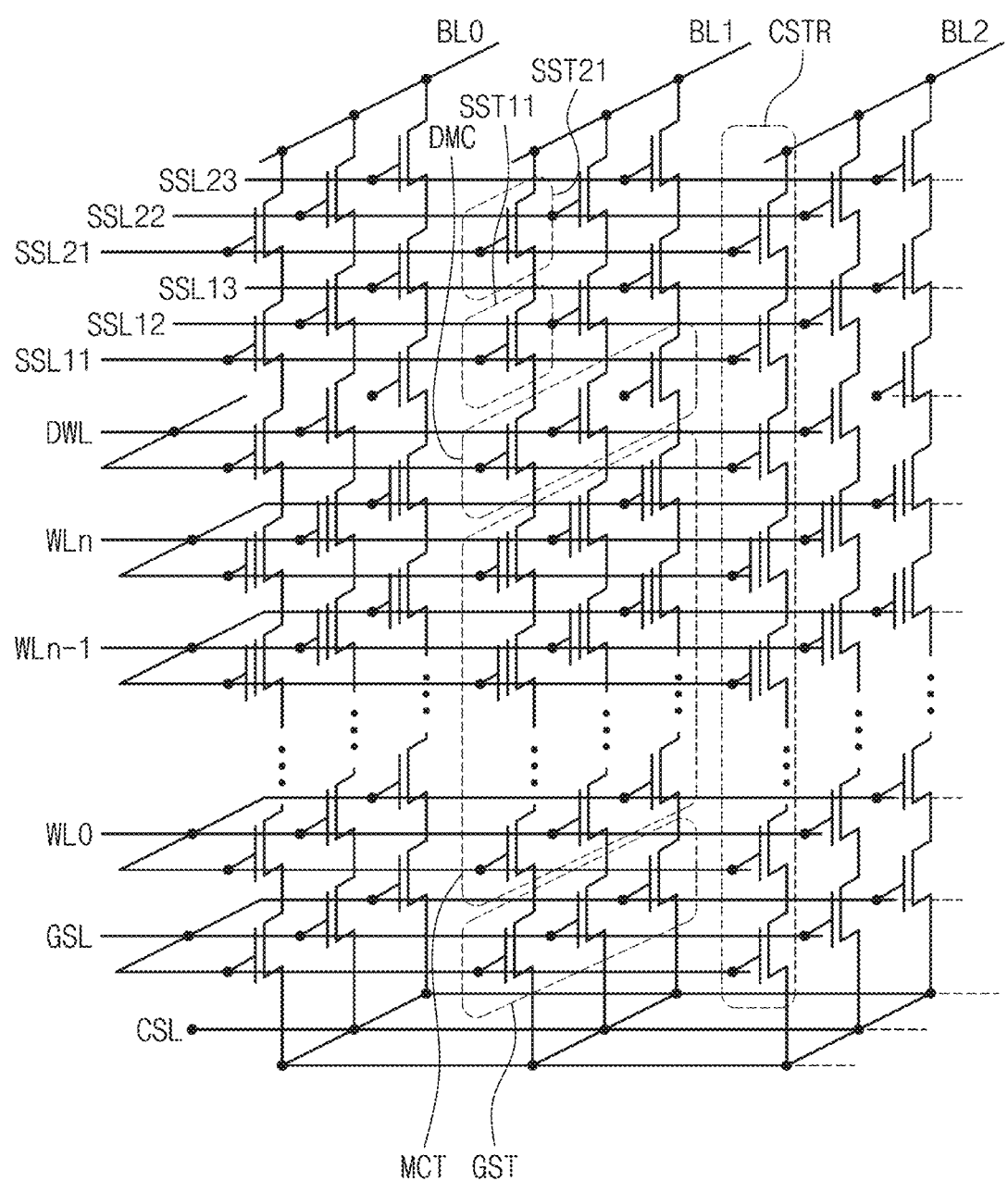
FIG. 3 is a schematic circuit diagram illustrating a 3D semiconductor memory device according to some embodiments of the inventive concepts.

FIG. 3 is a schematic circuit diagram illustrating a 3D semiconductor memory device according to some embodiments of the inventive concepts.

Referring to FIG. 3, a cell array of a 3D semiconductor memory device according to some embodiments may include a common source line CSL, a plurality of bit lines BL0 to BL2, and/or a plurality of cell strings CSTR provided between the common source line CSL and the bit lines BL0 to BL2.

The bit lines BL0 to BL2 may be two-dimensionally arranged, and a plurality of the cell strings CSTR may be connected in parallel to each of the bit lines BL0 to BL2. The cell strings CSTR may be connected in common to the common source line CSL. In other words, a plurality of the cell strings CSTR may be disposed between one common source line CSL and a plurality of the bit lines BL0 to BL2. The common source line CSL may be provided in plurality, and the plurality of common source lines CSL may be two-dimensionally arranged. In some embodiments, the same voltage may be applied to the plurality of common source lines CSL. In certain embodiments, the common source lines CSL may be electrically controlled independently of each other.

In some embodiments, one of the cell strings CSTR may include string selection transistors SST21 and SST11 connected in series to each other, memory cells MCT connected in series to each other, and a ground selection transistor GST. Each of the memory cells MCT may include a data storage element.

For example, a (2-1)th string selection transistor SST21 may be connected to one of the bit lines BL0 to BL2, and the ground selection transistor GST may be connected to the common source line CSL. The memory cells MCT may be connected in series between a (1-1)th string selection transistor SST11 and the ground selection transistor GST.

In addition, one of the cell strings CSTR may further include a dummy cell DMC connected between the (1-1)th string selection transistor SST11 and the memory cell MCT. Although not shown in the drawings, an additional dummy cell may be connected between the ground selection transistor GST and the memory cell MCT adjacent to the ground selection transistor GST.

According to certain embodiments, in each of the cell strings CSTR, the ground selection transistor GST may include a plurality of MOS transistors connected in series to each other, similarly to the (1-1)th and (2-1)th string selection transistors SST11 and SST21. In certain embodiments, each of the cell strings CSTR may include a single string selection transistor.

In some embodiments, the (1-1)th string selection transistor SST11 may be controlled by a (1-1)th string selection line SSL11, and the (2-1)th string selection transistor SST21 may be controlled by a (2-1)th string selection line SSL21. The memory cells MCT may be controlled by a plurality of word lines WL0 to WLn, and the dummy cell DMC may be controlled by a dummy word line DWL. The ground selection transistor GST may be controlled by a ground selection line GSL. The common source line CSL may be connected in common to sources of the ground selection transistors GST.

One cell string CSTR may include the plurality of memory cells MCT respectively disposed at different distances from the common source line CSL. The word lines WL0 to WLn and DWL may be disposed between the common source line CSL and the bit lines BL0 to BL2.

Gate electrodes of the memory cells MCT (or the dummy cells) disposed at the same level from the common source line CSL may be connected in common to one of the word lines WL0 to WLn and DWL so as to be in an equipotential state. Alternatively, even though the gate electrodes of the memory cells MCT are disposed at substantially the same level from the common source line CSL, the gate electrodes disposed in one row (or one column) may be controlled independently of the gate electrodes disposed in another row (or another column).

Figure 4:
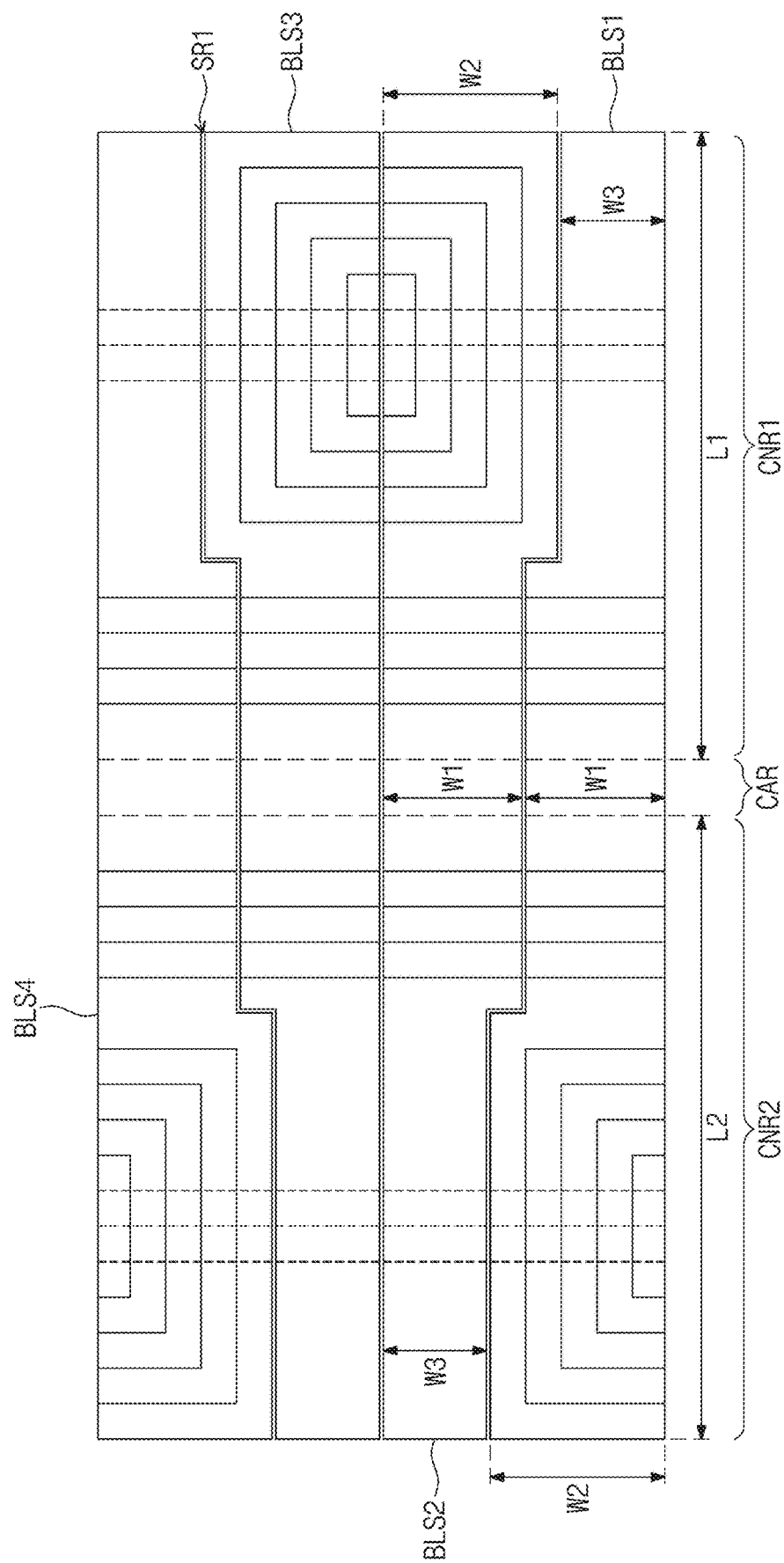
FIG. 4 is a plan view illustrating an electrode structure of a 3D semiconductor memory device according to some embodiments of the inventive concepts.
Figure 5:
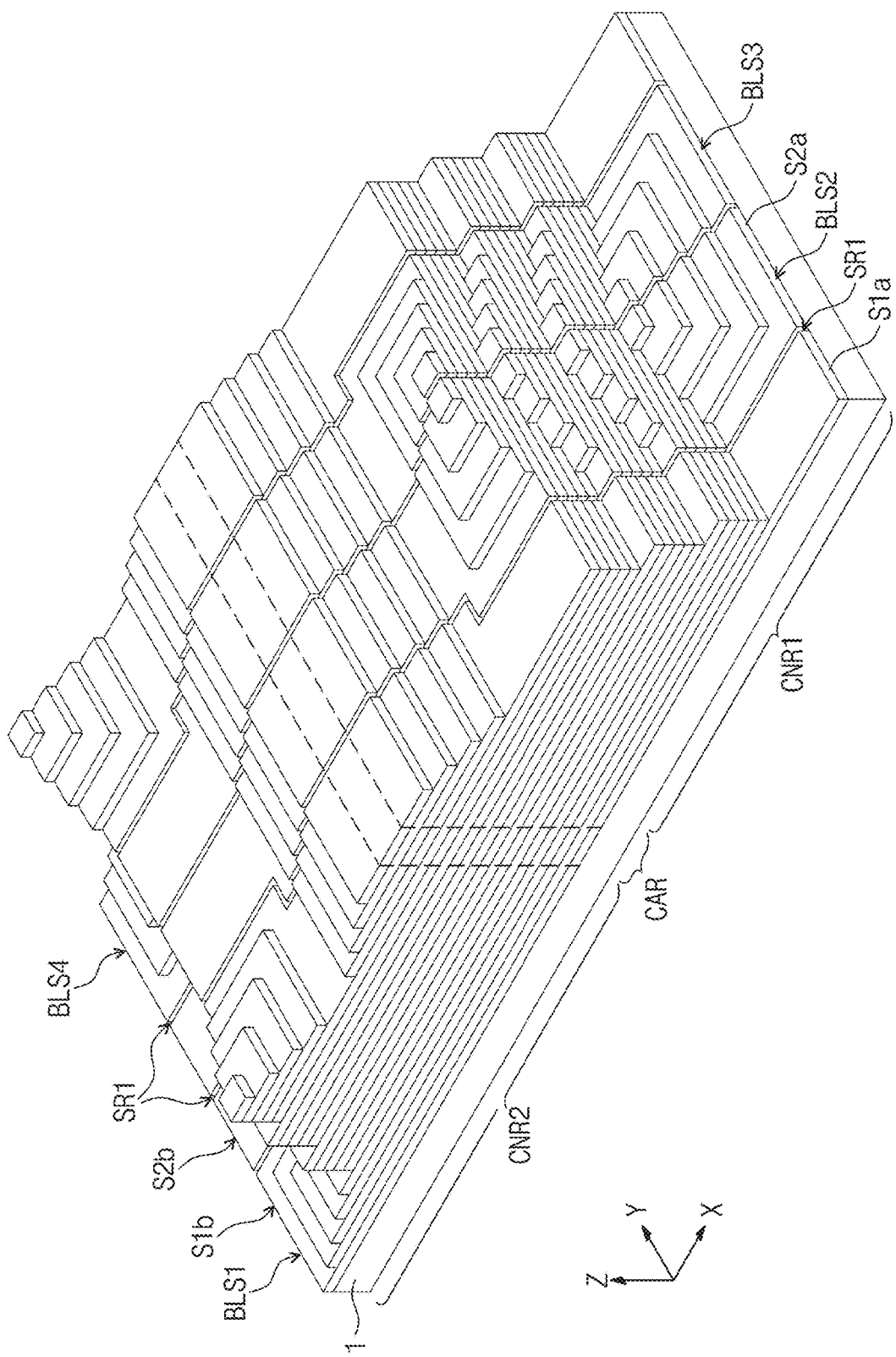
FIG. 5 is a perspective view illustrating an electrode structure of a 3D semiconductor memory device according to some embodiments of the inventive concepts.

FIG. 4 is a plan view illustrating an electrode structure of a 3D semiconductor memory device according to some embodiments of the inventive concepts. FIG. 5 is a perspective view illustrating an electrode structure of a 3D semiconductor memory device according to some embodiments of the inventive concepts.

Referring to FIGS. 4 and 5, a substrate 1 may be provided. The substrate 1 may include first and second connection regions CNR1 and CNR2 spaced apart from each other in a first direction X and a cell array region CAR disposed between the first and second connection regions CNR1 and CNR2. First to fourth block structures BLS1, BLS2, BLS3 and BLS4 spaced apart from each other in a second direction Y intersecting the first direction X may be disposed on the substrate 1. The second block structure BLS2 may have a structure in which the first block structure BLS1 is rotated 180 degrees in a plan view, and the fourth block structure BLS4 may have a structure in which the third block structure BLS3 is rotated 180 degrees in a plan view. The second block structure BLS2 and the fourth block structure BLS4 may be disposed to mesh with the first block structure BLS1 and the third block structure BLS3, respectively. The second block structure BLS2 may have a structure symmetrical with that of the third block structure BLS3.

Block separation regions SR1 may be provided between the first to fourth block structures BLS1 to BLS4, respectively. The block separation regions SR1 between the first and second block structures BSL1 and BSL2 and between the third and fourth block structures BLS3 and BLS4 may have staircase shapes when viewed in a plan view. The block separation region SR1 between the second and third block structures BLS2 and BLS3 may have a straight line shape when viewed in a plan view. The neighboring block separation regions SR1 may be spaced apart from each other from the first connection region CNR1 to the second connection region CNR2 without being in contact with each other. This structure may easily control a recess depth in an etching process for forming the block separation region SR1.

If planar shapes of neighboring block separation regions SR1 meet with each other on the first or second connection region CNR1 or CNR2 to form a triple point (where three lines meet with each other) or a quadruple point (where four lines meet with each other) unlike FIG. 4, it may be very difficult to control the recess depth in the etching process for forming the block separation regions SR1. However, according to embodiments of the inventive concepts, the neighboring block separation regions SR1 may be spaced apart from each other like FIG. 4, and thus these limitations may be solved.

As illustrated in FIG. 4, the second block structure BLS2 may have a first width W1 parallel to the second direction Y on the cell array region CAR. The second block structure BLS2 may have a second width W2 parallel to the second direction Y on the first connection region CNR1. The second block structure BLS2 may have a third width W3 parallel to the second direction Y on the second connection region CNR2. The first width W1 may be less than the second width W2 and may be greater than the third width W3. A sum of the second width W2 and the third width W3 may correspond to about twice the first width W1. The relation of widths of the third block structure BLS3 may be the same as the relation of the widths of the second block structure BLS2.

The first block structure BLS1 may have the first width W1 parallel to the second direction Y on the cell array region CAR. The first block structure BLS1 may have the third width W3 parallel to the second direction Y on the first connection region CNR1. The first block structure BLS1 may have the second width W2 parallel to the second direction Y on the second connection region CNR2. The relation of widths of the fourth block structure BLS4 may be the same as the relation of the widths of the first block structure BLS1.

Each of the first to fourth block structures BLS1 to BLS4 may have a first length L1 parallel to the first direction X on the first connection region CNR1. Each of the first to fourth block structures BLS1 to BLS4 may have a second length L2 parallel to the first direction X on the second connection region CNR2. The first length L1 may be equal to the second length L2.

Referring to FIG. 5, a first end sidewall S1a of the first block structure BLS1 may be aligned with a first end sidewall S2a of the second block structure BLS2 on the first connection region CNR1 when viewed in a plan view. In addition, a second end sidewall S1b of the first block structure BLS1 may be aligned with a second end sidewall S2b of the second block structure BLS2 on the second connection region CNR2 when viewed in a plan view. The first to fourth block structures BLS1 to BLS4 may have staircase structures on the first and second connection regions CNR1 and CNR2. These will be described in more detail.

Figure 6:
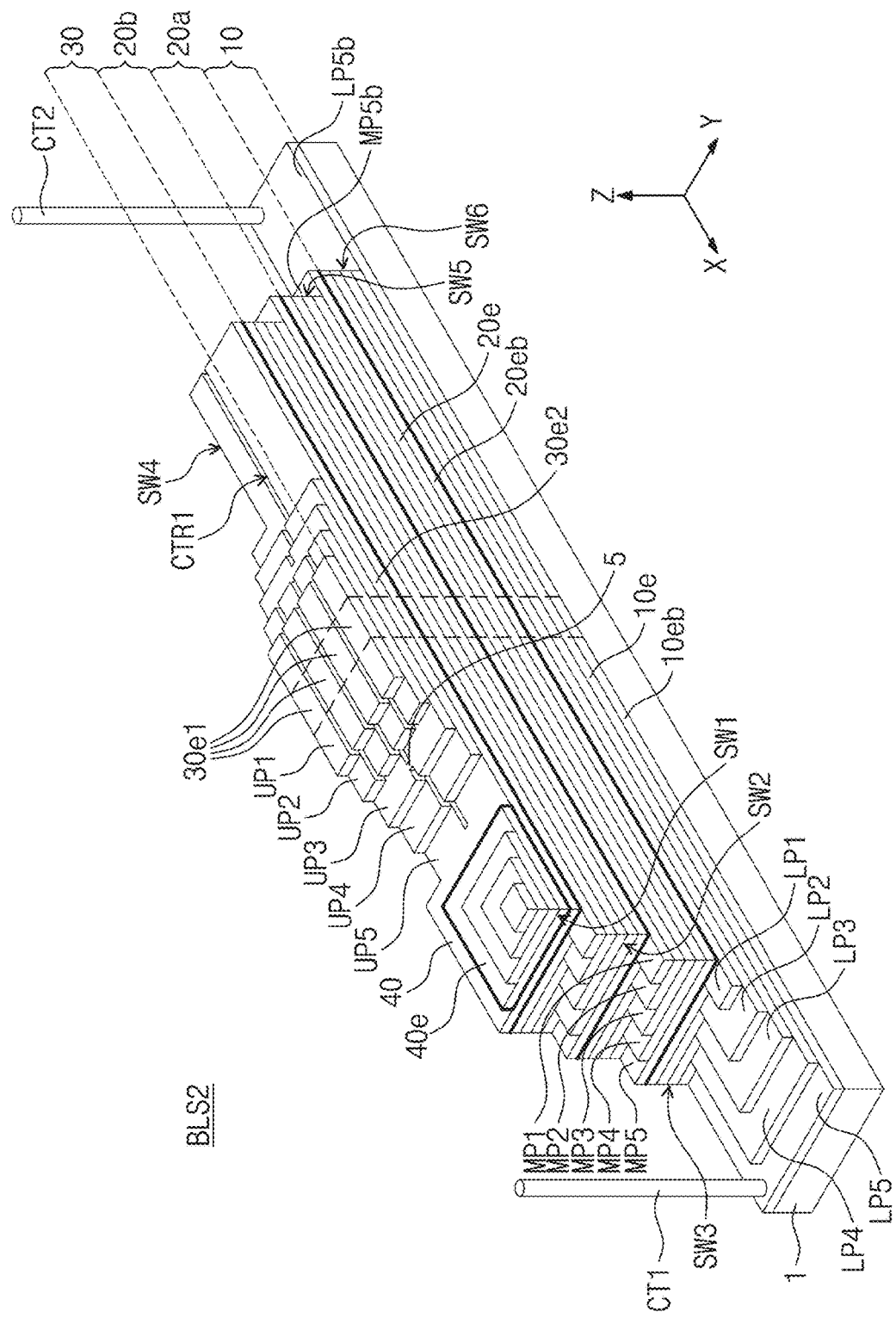
FIG. 6 is a perspective view illustrating a second block structure of the 3D semiconductor memory device of FIG. 5.
Figure 7:
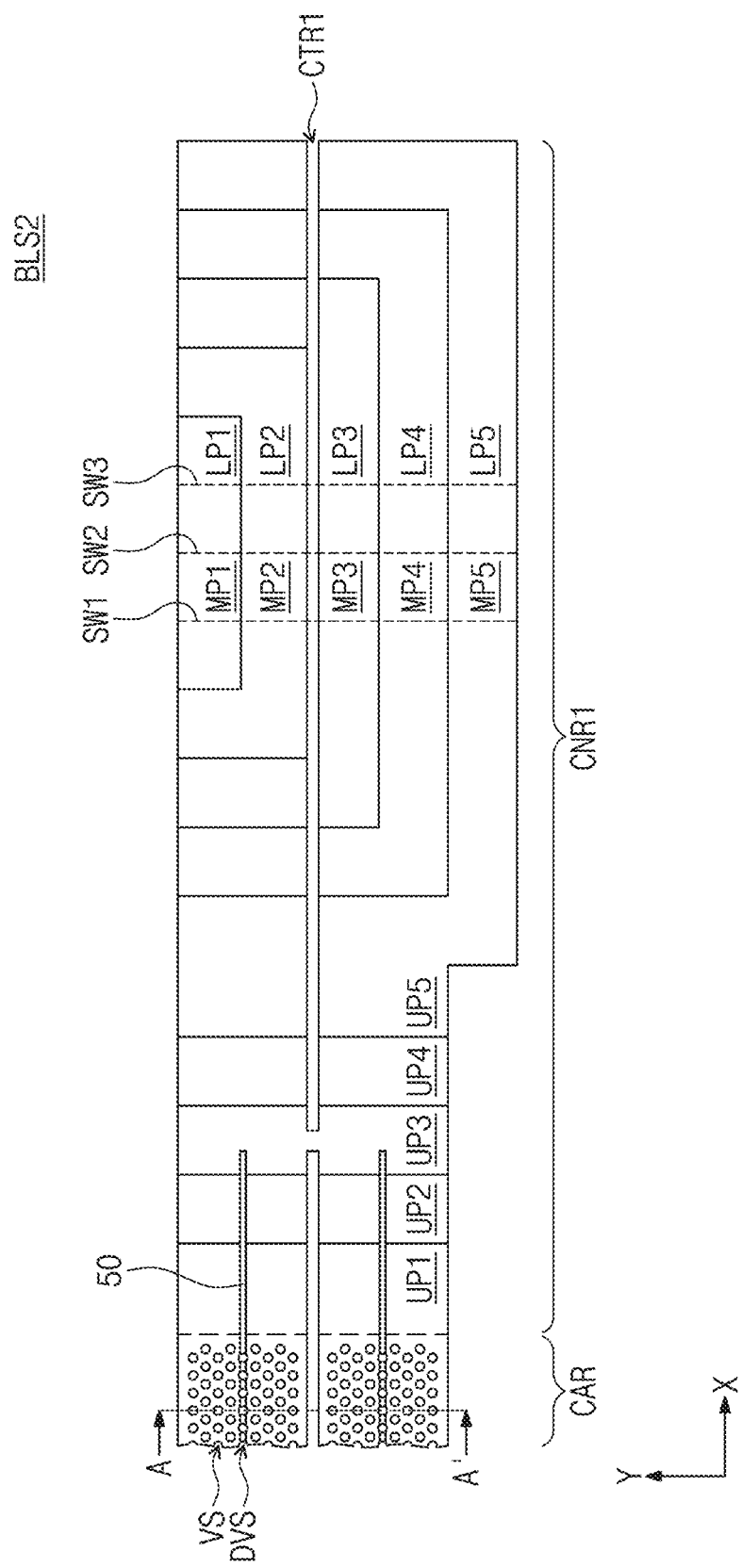
FIG. 7 is a plan view illustrating a portion of a second block structure of the 3D semiconductor memory device of FIG. 4.
Figure 8A:
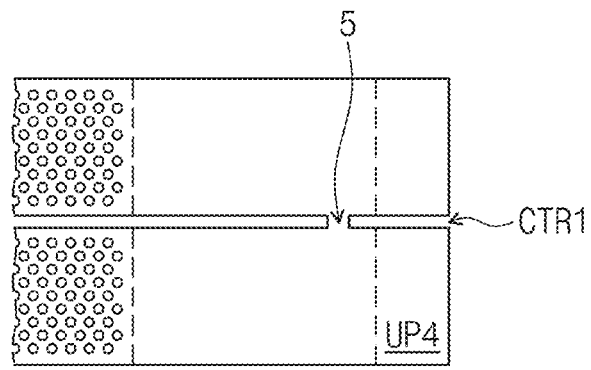
FIGS. 8A to 8D are plan views illustrating structures of some electrodes of the 3D semiconductor memory device of FIG. 6.
Figure 8B:
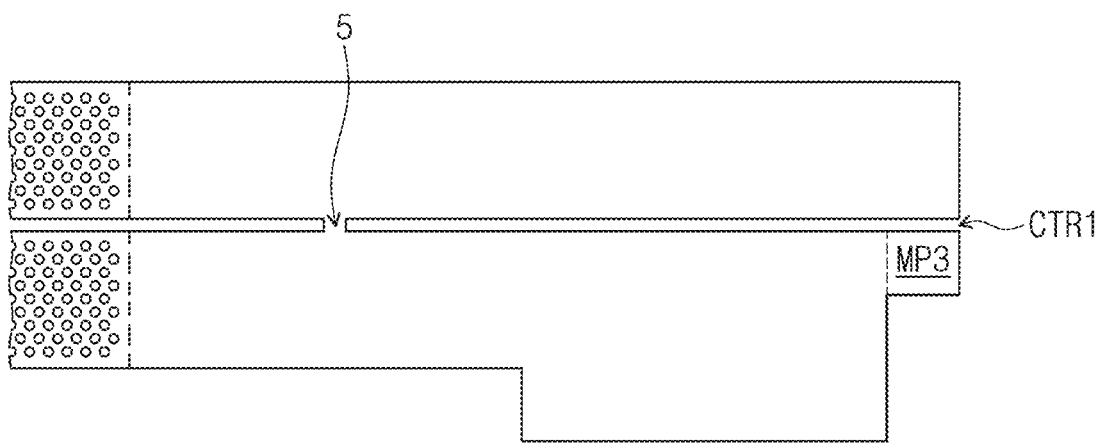
Figure 8C:
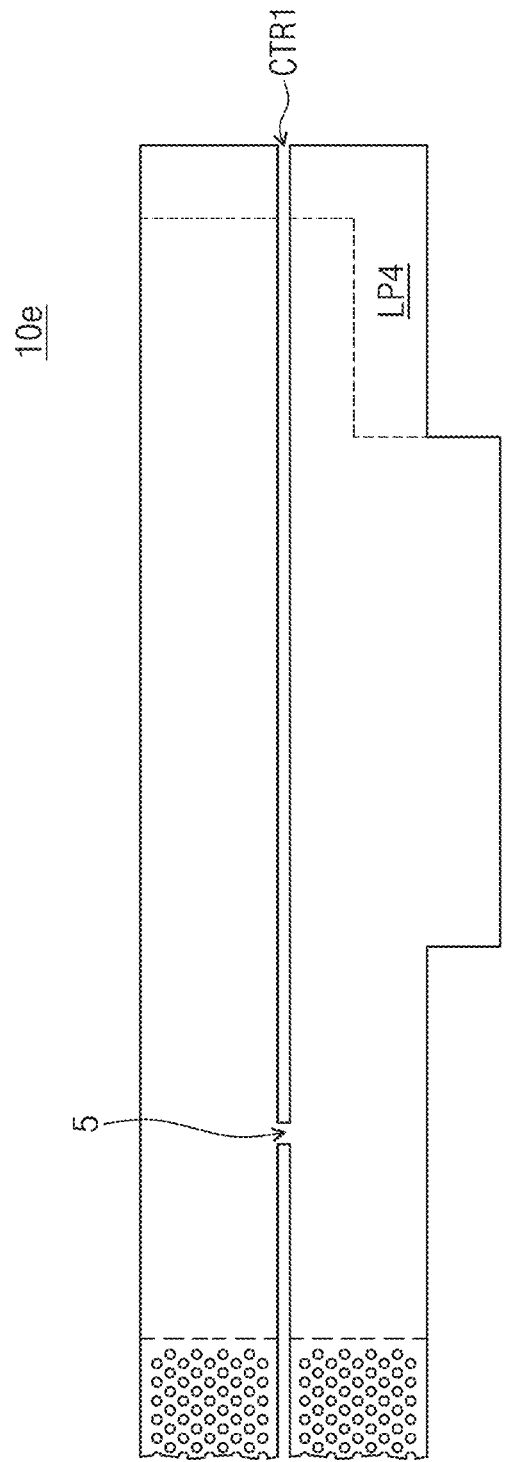

FIG. 6 is a perspective view illustrating a second block structure of the 3D semiconductor memory device of FIG. 5. FIG. 7 is a plan view illustrating a portion of a second block structure of the 3D semiconductor memory device of FIG. 4. FIGS. 8A to 8D are plan views illustrating structures of some electrodes of the 3D semiconductor memory device of FIG. 6. FIGS. 8A to 8C illustrate structures of some electrodes on the cell array region CAR and the first connection region CNR1 except the second connection region CNR2.

Referring to FIGS. 6, 7 and 8A to 8D, the second block structure BLS2 may include a lower stack structure 10, first and second intermediate stack structures 20a and 20b and an upper stack structure 30, which are sequentially stacked on the substrate 1.

The lower stack structure 10 may include a plurality of lower electrodes 10e and 10eb vertically stacked. The lower electrodes 10e and 10eb may have a staircase structure inclined in both the first direction X and the second direction Y on the first connection region CNR1. The lower electrodes 10e and 10eb may have first to fifth lower pad regions LP1 to LP5. The first to fifth lower pad regions LP1 to LP5 may constitute a staircase structure inclined downward in the first direction X and a direction opposite to the second direction Y. Areas of the first to fifth lower pad regions LP1 to LP5 may sequentially decrease as a vertical distance from the substrate 1 increases. In other words, the fifth lower pad region LP5 located at the lowermost position may have the widest area, and the first lower pad region LP1 located at the uppermost position may have the narrowest area. The second to fifth lower pad regions LP2 to LP5 may have L-shapes when viewed in a plan view. Although not shown in FIGS. 6 and 7, insulating layers ILD (see FIG. 9) may be disposed between the lower stack structure 10 and the substrate 1 and between the lower electrodes 10e and 10eb, and thus the substrate 1 and the lower electrodes 10e and 10eb may be vertically spaced apart from each other.

The first and second intermediate stack structures 20a and 20b may be offset from each other in the first direction X. Each of the first and second intermediate stack structures 20a and 20b may include a plurality of intermediate electrodes 20e and 20eb vertically stacked. The intermediate electrodes 20e and 20eb may have a staircase structure inclined in the second direction Y on the first connection region CNR1. The intermediate electrodes 20e and 20eb may have first to fifth intermediate pad regions MP1 to MP5. The first to fifth intermediate pad regions MP1 to MP5 may constitute a staircase structure inclined downward in the direction opposite to the second direction Y. Although not shown in FIGS. 6 and 7, insulating layers ILD (see FIG. 9) may be disposed between the lower stack structure 10 and the first and second intermediate stack structures 20a and 20b and between the intermediate electrodes 20e and 20eb, and thus the intermediate electrodes 20e and 20eb may be vertically spaced apart from each other.

The upper stack structure 30 may include second upper electrodes 30e2 and first upper electrodes 30e1, which are vertically stacked. The first upper electrodes 30e1 may have line shapes spaced apart from each other in the second direction Y when viewed in a plan view. End portions of the first upper electrodes 30e1 may constitute staircase shapes inclined in the first direction X on the first and second connection regions CNR1 and CNR2. For example, the first upper electrodes 30e1 may include first and second upper pad regions UP1 and UP2 on the first connection region CNR1. End portions of the second upper electrodes 30e2 may constitute staircase shapes inclined in the first direction X on the first and second connection regions CNR1 and CNR2.

The second upper electrodes 30e2 may include third to fifth upper pad regions UP3 to UP5 on the first connection region CNR1. The first to fifth upper pad regions UP1 to UP5 may constitute a staircase structure inclined downward in the first direction X. An area of the fifth upper pad region UP5 located at the lowermost position may be wider than an area of each of the first to fourth upper pad regions UP1 to UP4. Although not shown in FIGS. 6 and 7, insulating layers ILD (see FIG. 9) may be disposed between the second intermediate stack structure 20b and the upper stack structure 30 and between the first and second upper electrodes 30e1 and 30e2, and thus the upper electrodes 30e1 and 30e2 may be vertically spaced apart from each other.

A dummy stack structure 40 may be disposed on the fifth upper pad region UP5 on the first connection region CNR1. The dummy stack structure 40 may include vertically stacked dummy electrodes 40e. The dummy electrodes 40e may have a staircase structure inclined in the first direction X and the second direction Y. Although not shown in FIGS. 6 and 7, insulating layers may be disposed between the fifth upper pad region UP5 and the dummy stack structure 40 and between the dummy electrodes 40e, and thus the fifth upper pad region UP5 and the dummy electrodes 40e may be vertically spaced apart from each other. A voltage may not be applied to the dummy electrodes 40e, and thus the dummy electrodes 40e may be floated.

The dummy electrodes 40e constituting the dummy stack structure 40 may have first sidewalls SW1 that are exposed in the first direction X on the first connection region CNR1 and are vertically aligned with each other. The intermediate electrodes 20e constituting the second intermediate stack structure 20b may have second sidewalls SW2 that are exposed in the first direction X on the first connection region CNR1 and are vertically aligned with each other. The intermediate electrodes 20e constituting the first intermediate stack structure 20a may have third sidewalls SW3 that are exposed in the first direction X on the first connection region CNR1 and are vertically aligned with each other. The first to third sidewalls SW1, SW2 and SW3 may be offset from each other.

The intermediate electrodes 20e except the lowermost intermediate electrode 20eb in the second intermediate stack structure 20b and the lowermost one of the second upper electrodes 30e2 may have fourth sidewalls SW4 vertically aligned with each other on the second connection region CNR2. The intermediate electrodes 20e except the lowermost intermediate electrode 20eb in the first intermediate stack structure 20a and the lowermost intermediate electrode 20eb of the second intermediate stack structure 20b may have fifth sidewalls SW5 vertically aligned with each other on the second connection region CNR2. The lower electrodes 10e except the lowermost lower electrode 10eb in the lower stack structure 10 and the lowermost intermediate electrode 20eb of the first intermediate stack structure 20a may have sixth sidewalls SW6 vertically aligned with each other on the second connection region CNR2.

A cut region CTR1 may penetrate the lower stack structure 10, the first and second intermediate stack structures 20a and 20b and the upper stack structure 30 and may extend in the first direction X. The cut region CTR1 may exist on the cell array region CAR and the first and second connection regions CNR1 and CNR2. The cut region CTR1 may extend to edges of the second block structure BLS2 on the first and second connection regions CNR1 and CNR2.

Each of the second upper electrodes 30e2, the intermediate electrodes 20e and 20eb and the lower electrodes 10e and 10eb may include an electrode connection portion 5 on each of the first and second connection regions CNR1 and CNR2 to prevent each of the electrodes 30e2, 20e, 20eb, 10e and 10eb from being divided into segments by the cut region CTR1. Thus, segments of each of the second upper electrodes 30e2, the intermediate electrodes 20e and 20eb and the lower electrodes 10e and 10eb, which are disposed at the same height, may be in the same potential state. The cut region CTR1 may be spaced apart from the block separation region SR1.

Figure 8D:
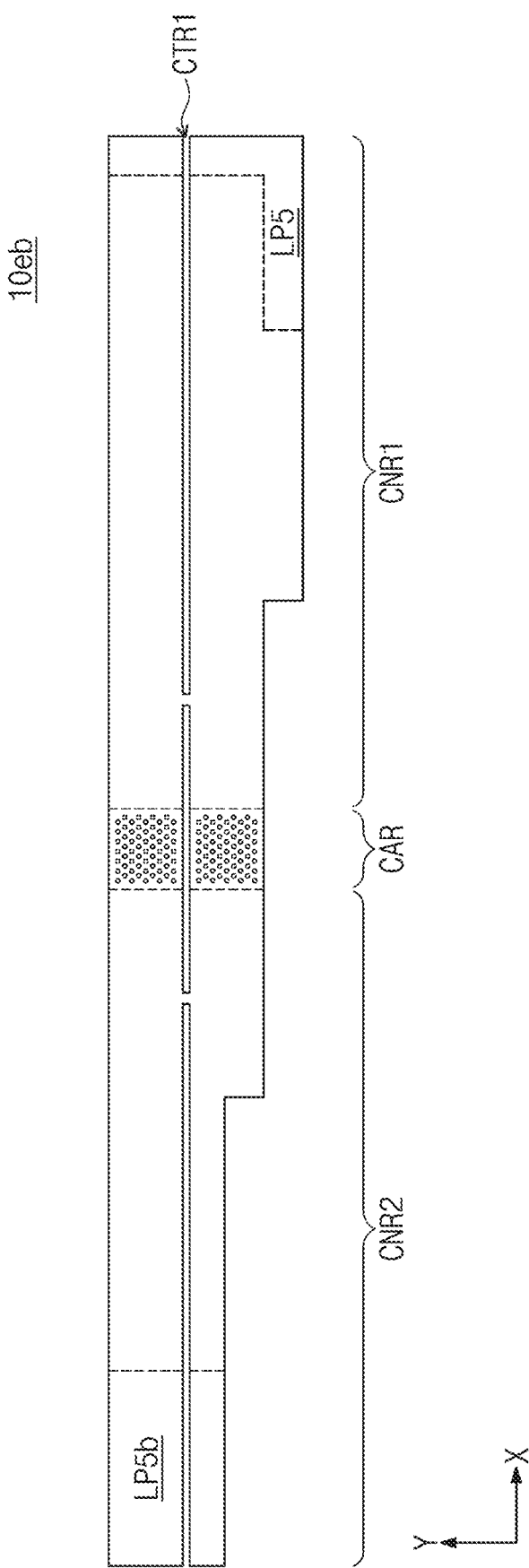

Referring to FIGS. 6 and 8D, the lowermost lower electrode 10eb and the lowermost intermediate electrodes 20eb of the first and second intermediate stack structures 20a and 20b may be exposed on the second connection region CNR2. In other words, the lowermost lower electrode 10eb may further have an auxiliary fifth lower pad region LP5b. The lowermost intermediate electrodes 20eb may further have auxiliary fifth intermediate pad regions MP5b.

A first contact plug CT1 may be disposed on the fifth lower pad region LP5, and a second contact plug CT2 may be disposed on the auxiliary fifth lower pad region LP5b. The lowermost lower electrode 10eb may correspond to the ground selection line GSL of FIG. 3. A voltage may be applied to both ends of the lowermost lower electrode 10eb through the first and second contact plugs CT1 and CT2, and thus a substantially uniform voltage may be applied to the whole of the ground selection line GSL without a voltage drop. As a result, performance and reliability of the 3D semiconductor memory device may be improved. Although not shown in the drawings, other contact plugs for applying voltages may be respectively disposed on other pad regions except the fifth lower pad region LP5 and the auxiliary fifth lower pad region LP5b.

In some embodiments, the number of the first upper electrodes 30e1 in the uppermost layer of the second block structure BLS2 may be less than the number of the upper pad regions UP1 to UP5. The number of the first upper electrodes 30e1 in the uppermost layer may be less than the number of the intermediate pad regions MP1 to MP5. The number of the first upper electrodes 30e1 in the uppermost layer may be less than the number of the lower pad regions LP1 to LP5. In the present example, the number of the first upper electrodes 30e1 in the uppermost layer is 4, and each of the numbers of the intermediate pad regions MP1 to MP5 and the lower pad regions LP1 to LP5 is 5. The number of the first upper electrodes 30e1 in the uppermost layer may correspond to the number of string selection lines (hereinafter, referred to as a SSL number) existing in the uppermost layer. The number of the intermediate pad regions MP1 to MP5 in one intermediate stack structure 20a or 20b or the number of the lower pad regions LP1 to LP5 in the lower stack structure 10 may correspond to the number of stair dividing patterns (SDP) (hereinafter, referred to as a SDP number). The SDP number may be greater than the SSL number and may be less than twice the SSL number. In other words, when the SSL number is n, the SDP number may be equal to or greater than n+1 and may be less than 2n. For example, in FIG. 6, the SSL number is 4 and the SDP number is 5. However, embodiments of the inventive concepts are not limited thereto. When the SSL number is 4, the SDP number may range from 5 to 7.

In embodiments of the inventive concepts, the widths of the block structures BLS1 to BLS4 may be changed on the connection regions CNR1 and CNR2. In other words, the widths of end portions of the block structures BLS1 to BLS4 on the connection regions CNR1 and CNR2 may be greater than the widths of the block structures BLS1 to BLS4 on the cell array region CAR. Thus, a space for the stair dividing patterns may be secured regardless of the SSL number. As a result, a bridge between contact plugs may be prevented and a degree of freedom of interconnection lines may be increased.

In addition, Although not shown in the drawings, dummy vertical channels may be disposed to penetrate the pad regions, and thus it is possible to prevent the block structures BLS1 to BLS4 from collapsing or leaning in manufacturing processes. According to embodiments of the inventive concepts, areas of the pad regions may be increased by changing the width of the block structure on the connection region, and thus the dummy vertical channels may be easily disposed. As a result, the reliability of the 3D semiconductor memory device may be improved.

In addition, the number of the stair dividing patterns may be increased more than the number of the string selection lines. Moreover, the block structures may be disposed to mesh or engage with each other. Thus, a total area of the 3D semiconductor memory device may be reduced to improve the integration density of the 3D semiconductor memory device. The detailed structure of the second block structure BLS2 was described above as an example with reference to FIGS. 6, 7 and 8A to 8D. However, detailed structures of the first, third and fourth block structures BLS1, BLS3 and BLS4 of FIG. 5 may be the same/similar as that of the second block structure BLS2. Each of the first, third and fourth block structures BLS1, BLS3 and BLS4 of FIG. 5 may be symmetrical with the second block structure BLS2 or may have a structure in which the second block structure BLS2 is rotated 180 degrees in a plan view.

Figure 9:
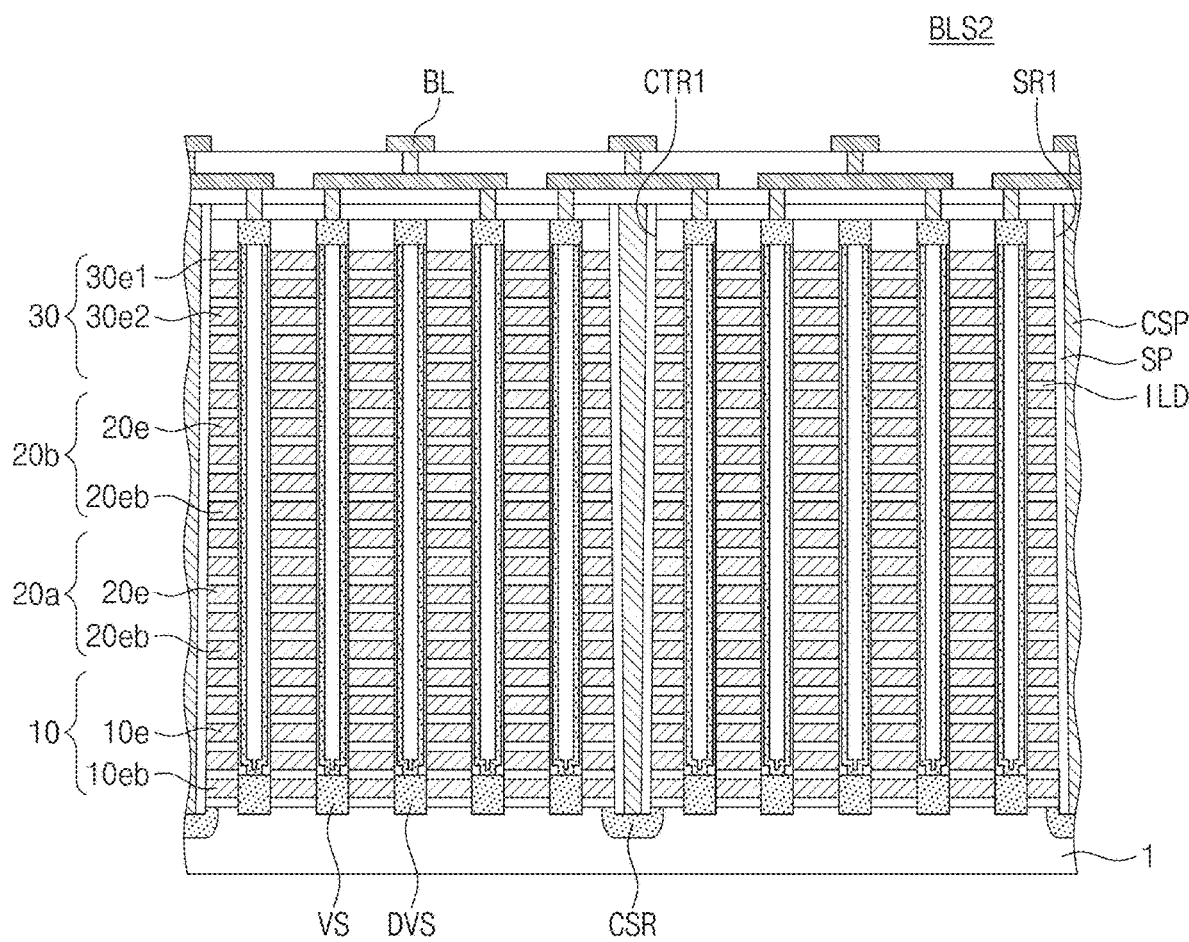
FIG. 9 is a cross-sectional view taken along a line A-A' of FIG. 7.

FIG. 9 is a cross-sectional view taken along a line A-A' of FIG. 7.

Referring to FIGS. 6, 7 and 9, vertical channels VS and dummy vertical channels DVS may be disposed on the substrate 1 of the cell array region CAR and may extend in a third direction Z. The vertical channels VS and the dummy vertical channels DVS may penetrate the lower stack structure 10, the first and second intermediate stack structures 20a and 20b and the upper stack structure 30, described above. The vertical channels VS constituting two rows adjacent to each other may be arranged in a zigzag form in the second direction Y when viewed in a plan view. The dummy vertical channels DVS may be disposed between two first upper electrodes 30e1 adjacent to each other. An isolation insulating pattern 50 may be disposed between the two first upper electrodes 30e1 adjacent to each other and between the dummy vertical channels DVS.

The vertical channels VS and the dummy vertical channels DVS may include substantially the same materials and may have substantially the same structure. For example, the vertical channels VS and the dummy vertical channels DVS may have hollow pipe shapes or hollow macaroni shapes. Alternatively, the vertical channels VS and the dummy vertical channels DVS may have circular pillar shapes. The vertical channels VS may be electrically connected to bit lines BL. The dummy vertical channels DVS may not be connected to the bit lines BL but may be electrically floated.

A common source region CSR may be provided in the substrate 1 between electrode portions of the electrodes when viewed in a plan view. The common source region CSR may be formed by doping portions of the substrate 1 with dopants of a second conductivity type. A common source plug CSP may be connected to the common source region CSR, and a sidewall insulating spacer SP may be disposed between the common source plug CSP and the stack structures 10, 20a, 20b and 30. The common source plugs CSP may be disposed in the block separation region SR1 of FIG. 5 and the cut region CTR1 of FIG. 7.

The 3D semiconductor memory device of FIGS. 5 to 9 may be manufactured by the following processes.

Referring to FIGS. 5 to 9, insulating layers ILD and sacrificial layers (not shown) may be alternately stacked on the substrate 1 to form a stack structure, and a trimming process and an etching process may be repeated to form staircase shapes on the first and second connection regions CNR1 and CNR2, like FIG. 5. Vertical channels VS and dummy vertical channels DVS may be formed to penetrate the stack structure on the cell array region CAR. The stack structure may be divided by an etching process to form cut regions CTR1 and block separation regions SR1. At this time, since the block separation regions SR1 are not connected to each other, a recess depth may be easily controlled in the etching process. A replacement process of replacing the sacrificial layers (not shown) with conductive patterns may be performed through the cut regions CTR1 and the block separation regions SR1. Common source plugs CSP and sidewall insulating spacers SP may be formed in the cut regions CTR1 and the block separation regions SR1.

Figure 10A:
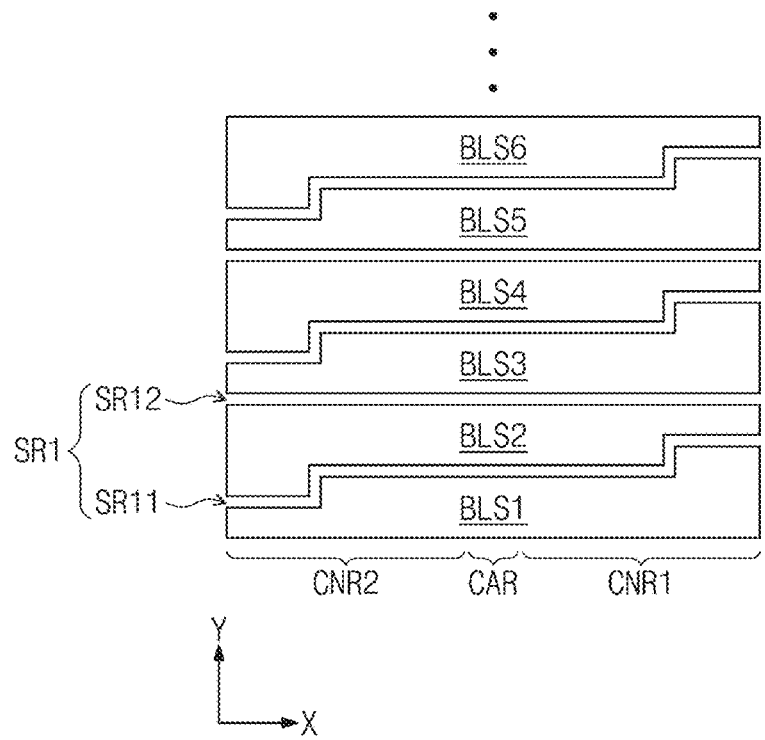
FIGS. 10A to 10C are plan views illustrating 3D semiconductor memory devices according to some embodiments of the inventive concepts.
Figure 10B:
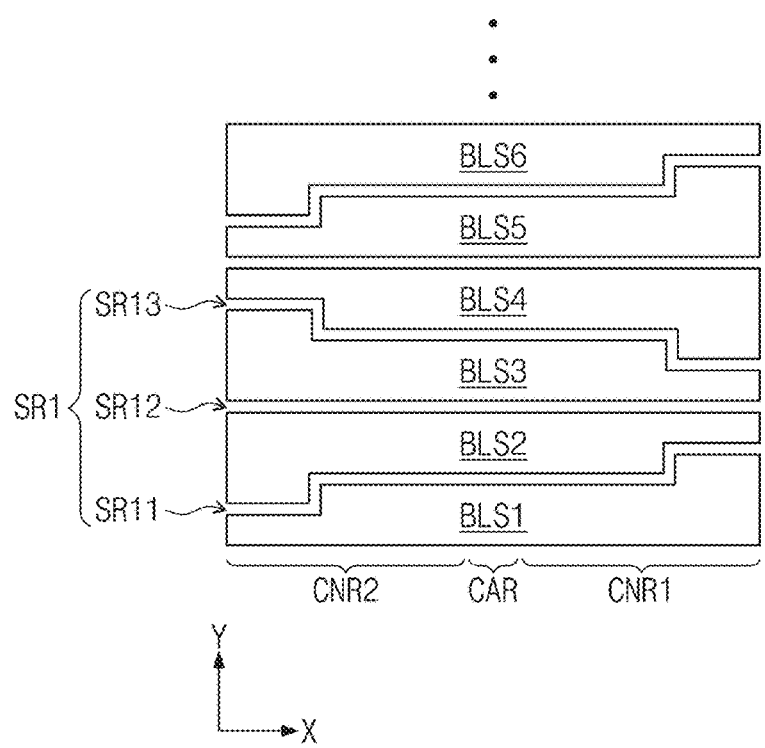
Figure 10C:
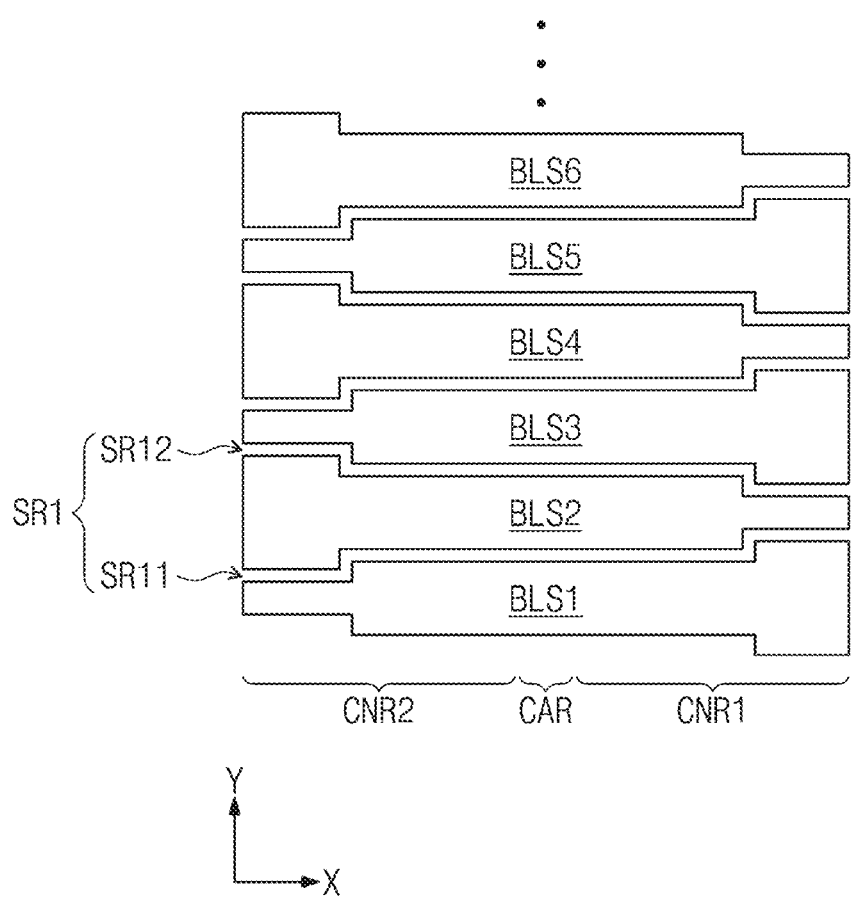

FIGS. 10A to 10C are plan views illustrating 3D semiconductor memory devices according to some embodiments of the inventive concepts.

Referring to FIGS. 10A to 10C, first to sixth block structures BLS1 to BLS6 may be spaced apart from each other in the second direction Y. The second, fourth and sixth block structures BLS2, BLS4 and BLS6 may have structures in which the first, third and fifth block structures BLS1, BLS3 and BLS5 are rotated 180 degrees in a plan view, respectively.

In FIG. 10A, the block separation regions SR1 may include first block separation regions SR11 and second block separation regions SR12, which are alternately arranged. Each of the first block separation regions SR11 may have a staircase shape inclined upward in the first direction X when viewed in a plan view. Each of the second block separation regions SR12 may have a straight line shape when viewed in a plan view.

Alternatively, in FIG. 10B, the block separation regions SR1 may include first block separation regions SR11, second block separation regions SR12 and third block separation regions SR13, which are alternately arranged. Each of the first block separation regions SR11 may have a staircase shape inclined upward in the first direction X when viewed in a plan view. Each of the second block separation regions SR12 may have a straight line shape when viewed in a plan view. Each of the third block separation regions SR13 may have a staircase shape inclined downward in the first direction X when viewed in a plan view.

Alternatively, in FIG. 10C, the block separation regions SR1 may include first block separation regions SR11 and second block separation regions SR12, which are alternately arranged. Each of the first block separation regions SR11 may have a staircase shape inclined upward in the first direction X when viewed in a plan view. Each of the second block separation regions SR12 may have a staircase shape inclined downward in the first direction X when viewed in a plan view.

Other structures and/or components may be the same/similar as described with reference to FIGS. 4 to 9.

Figure 11A:
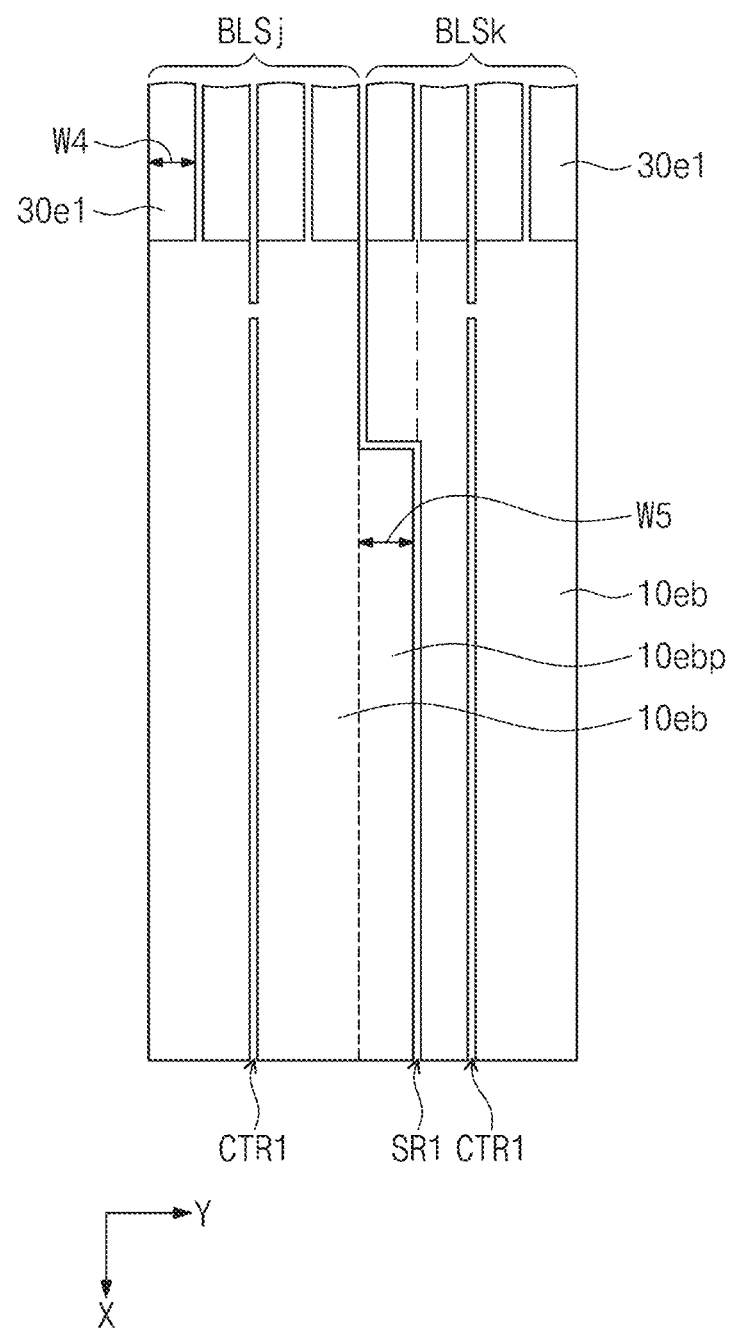
FIGS. 11A to 11D are plan views illustrating end portions in 3D semiconductor memory devices according to some embodiments of the inventive concepts.
Figure 11B:
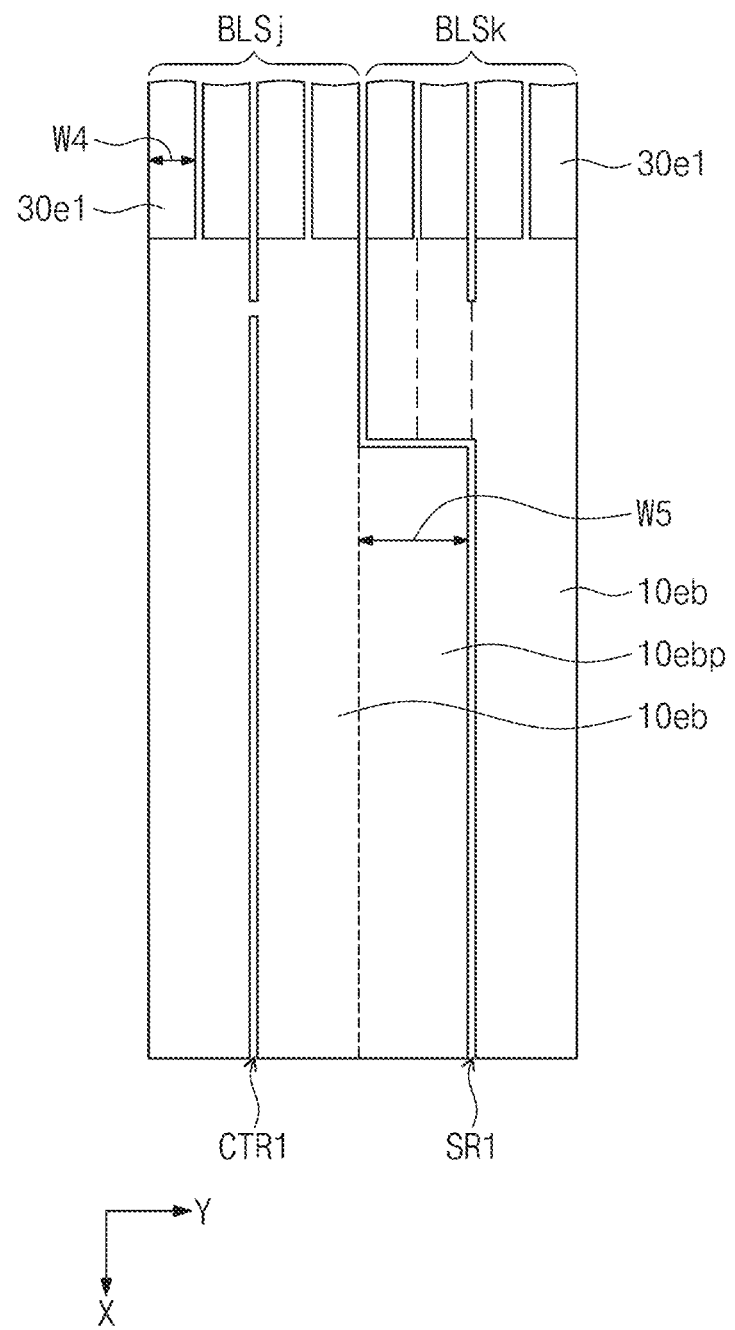
Figure 11C:
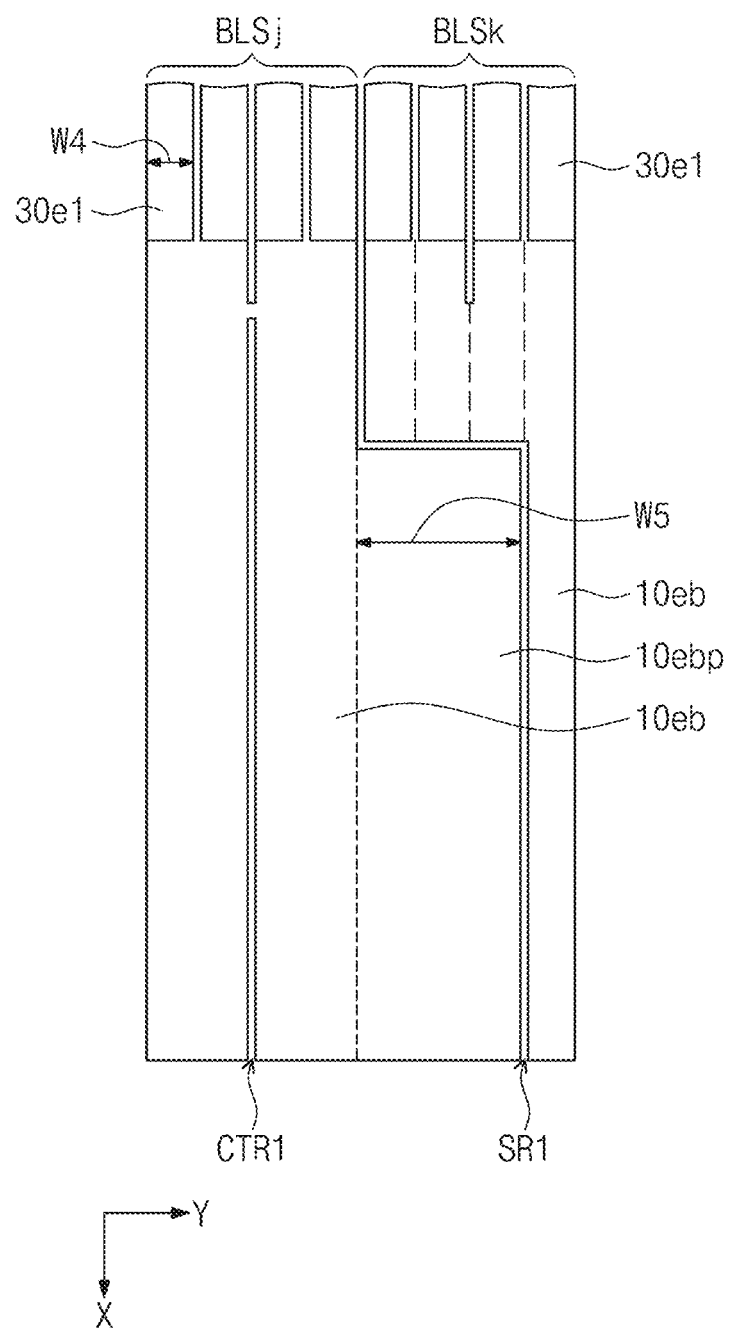

FIGS. 11A to 11D are plan views illustrating end portions in 3D semiconductor memory devices according to some embodiments of the inventive concepts. FIGS. 11A to 11C may correspond to plan views illustrating end portions of some of the block structures BLS1 to BLS6 on the connection region CNR1 or CNR2 in FIG. 10A or 10B.

Referring to FIGS. 11A to 11C, the block separation region SR1 may have a stepped shape when viewed in a plan view. The lowermost lower electrode 10eb of a j-th block structure BLSj may have a protrusion 10ebp protruding in the second direction Y in a plan view on the connection region CNR1 or CNR2. The first upper electrode 30e1 of the j-th block structure BLSj may have a fourth width W4 parallel to the second direction Y, and the protrusion 10ebp may have a fifth width W5 parallel to the second direction Y. The fifth width W5 may be substantially equal to the fourth width W4 like FIG. 11A, may correspond to about twice the fourth width W4 like FIG. 11B, or may correspond to about three times the fourth width W4 like FIG. 11C. In other words, the fifth width W5 may range from one to three times the fourth width W4. The lowermost lower electrode 10eb of a k-th block structure BLSk adjacent to the j-th block structure BLSj may be recessed in the second direction Y by the width of the protrusion 10ebp when viewed in a plan view.

In FIGS. 11A to 11C, since the number of the first upper electrodes 30e1 located in the uppermost layer in one block structure BLSj (i.e., the SSL number) is 4, the fifth width W5 may range from one to three times the fourth width W4. When the SSL number is n (a natural number) greater than 4, the fifth width W5 may range from one to (n−1) times the fourth width W4.

Figure 11D:
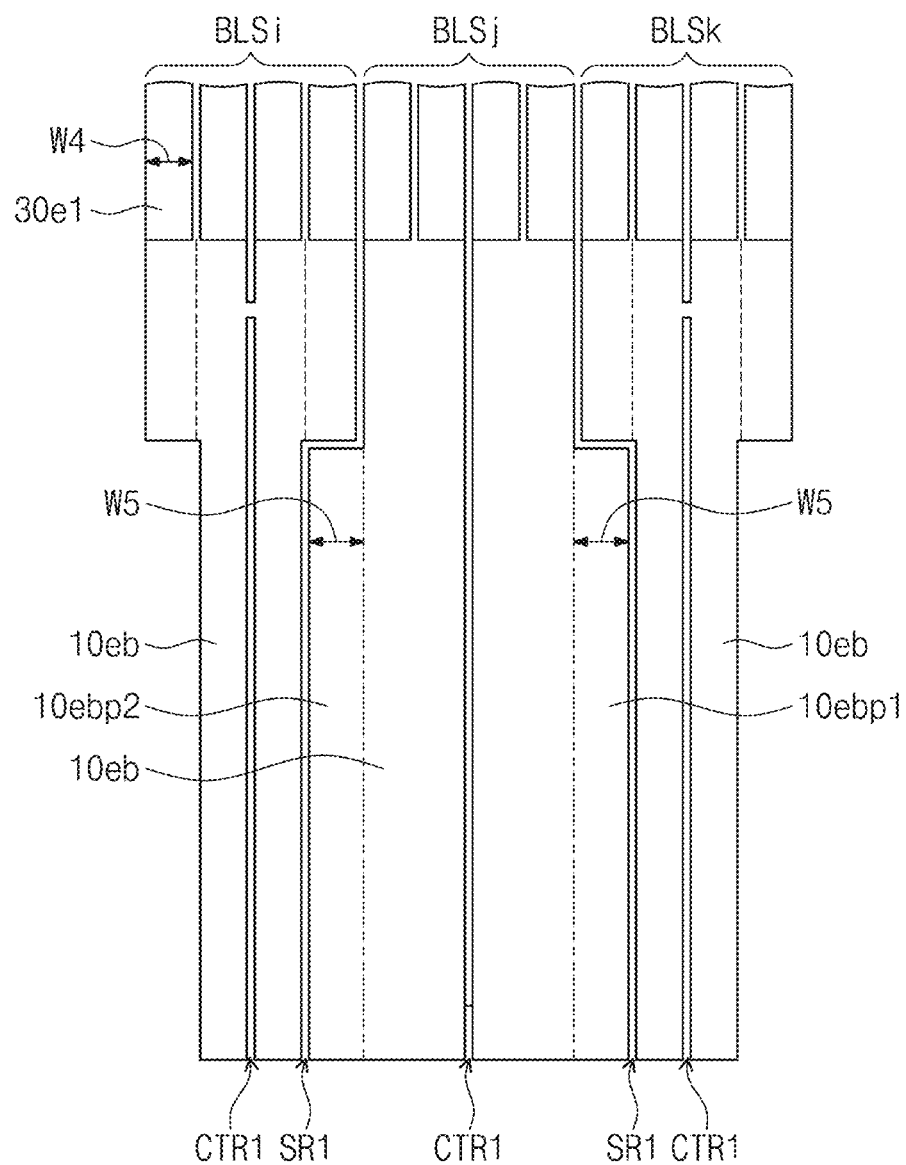

Alternatively, referring to FIG. 11D, the lowermost lower electrode 10eb of a j-th block structure BLSj may have a first protrusion 10ebp1 protruding in the second direction Y and a second protrusion 10ebp2 protruding in the direction opposite to the second direction Y on the connection region CNR1 or CNR2 when viewed in a plan view. Each of the first and second protrusions 10ebp1 and 10ebp2 may have a fifth width W5. The fifth width W5 may be substantially equal to the fourth width W4. Due to the first and second protrusions 10ebp1 and 10ebp2, each of the lowermost lower electrodes 10eb of i-th and k-th block structures BLSi and BLSk adjacent to the j-th block structure BLSj may be recessed in the second direction Y or the direction opposite to the second direction Y when viewed in a plan view.

In FIGS. 11A to 11D, planar shapes of the block structures BLSi, BLSj and BLSk may be the same/similar as planar shapes of the lowermost lower electrodes 10eb. In other words, shapes of the protrusions 10ebp, 10ebp1 and 10ebp2 may be projected to the entire portions of the block structures BLSi, BLSj and BLSk. In addition, shapes of the block separation regions SR1 of FIGS. 11A to 11D may be projected to the entire portions of the block structures BLSi, BLSj and BLSk. Other structures and/or components may be the same/similar as described with reference to FIGS. 4 to 9.

Figure 12A:
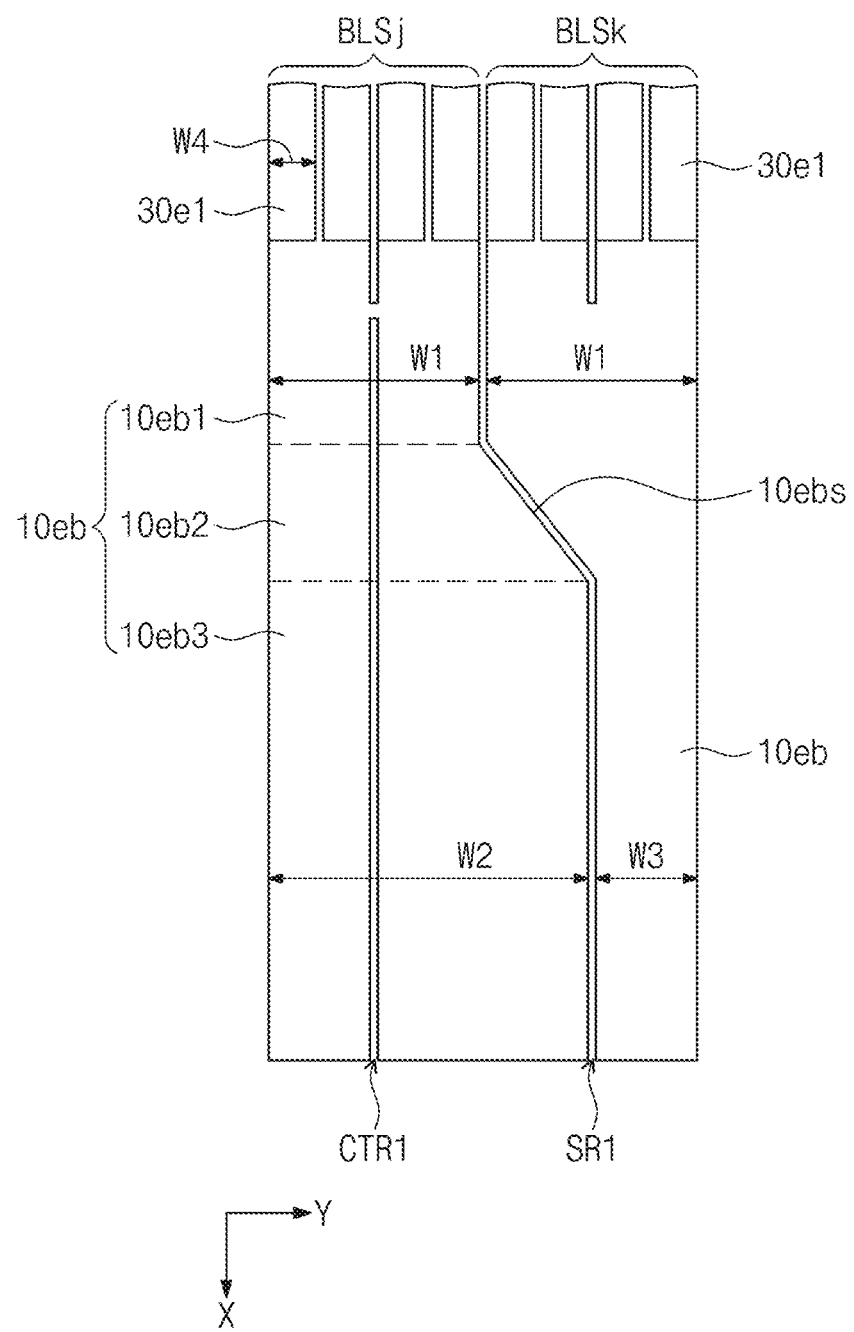
FIGS. 12A and 12B are plan views illustrating end portions in 3D semiconductor memory devices according to some embodiments of the inventive concepts.
Figure 12B:
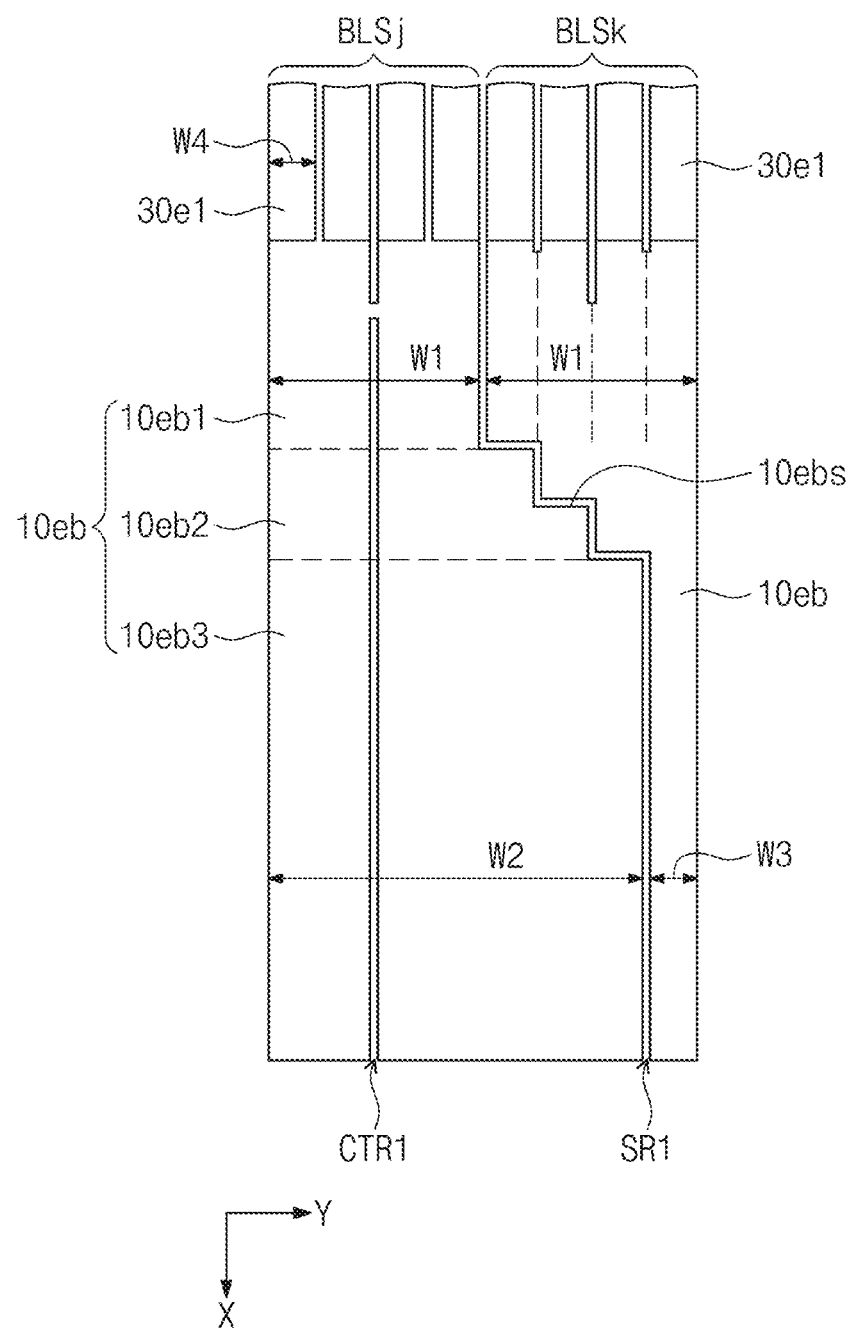

FIGS. 12A and 12B are plan views illustrating end portions in 3D semiconductor memory devices according to some embodiments of the inventive concepts.

Referring to FIGS. 12A and 12B, the lowermost lower electrode 10eb of a j-th block structure BLSj may include a first electrode portion 10eb1, a second electrode portion 10eb2 and a third electrode portion 10eb3, which are arranged in the first direction X. The first electrode portion 10eb1 may be adjacent to the cell array region CAR and may have the first width W1. The third electrode portion 10eb3 may be spaced apart from the first electrode portion 10eb1 and may be adjacent to an end of the connection region CNR1 or CNR2. The third electrode portion 10eb3 may have the second width W2. The second electrode portion 10eb2 may be disposed between the first and third electrode portions 10eb1 and 10eb3 to connect the first and third electrode portions 10eb1 and 10eb3. Like FIG. 12A, the second electrode portion 10eb2 may have an inclined sidewall 10ebs when viewed in a plan view. Alternatively, like FIG. 12B, the second electrode portion 10eb2 may have a sidewall 10ebs of a staircase shape when viewed in a plan view. Thus, a block separation region SR1 may have a diagonal shape or a staircase shape when viewed in a plan view.

In FIGS. 12A and 12B, planar shapes of the block structures BLSj and BLSk may be the same/similar as planar shapes of the lowermost lower electrodes 10eb. In other words, a shape of the sidewall 10ebs of the second electrode portion 10eb2 may be projected to the entire portion of the block structure BLSj. In addition, shapes of block separation regions SR1 of FIGS. 12A and 12B may be projected to the entire portions of the block structures BLSj and BLSk. Other structures and/or components may be the same/similar as described with reference to FIGS. 4 to 9.

According to embodiments of the inventive concepts, the block separation regions separating the block structures may not be in contact with each other but may be spaced apart from each other, and thus it may be easy to control a recess depth in the etching process for forming the block separation regions.

In addition, the width of the block structure may be changed on the connection region. Thus, the areas of the pad regions may be increased to prevent a bridge between contact plugs and to increase the degree of freedom of interconnection lines. As a result, the reliability of the 3D semiconductor memory device may be improved.

Moreover, the number of the stair dividing patterns may be increased more than the number of the string selection lines. Furthermore, the block structures may be disposed to mesh or engage with each other. Thus, a total area of the 3D semiconductor memory device may be reduced to improve the integration density of the 3D semiconductor memory device.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a substrate including a first connection region and a second connection region in a first direction and a cell array region between the first and second connection regions; and
   a first block structure on the substrate, the first block structure having a first edge,
   wherein the first block structure has a first width on the cell array region,
   wherein the first block structure has a second width on the first connection region,
   wherein the first block structure has a third width on the second connection region,
   wherein the first width, the second width and the third width are parallel to a second direction intersecting the first direction and each of the first, second, and third widths extend from the first edge towards an edge opposite the first edge, and
   wherein the first width is less than the second width and is greater than the third width.

2. The 3D semiconductor memory device of claim 1, further comprising:
   a second block structure and a third block structure spaced apart from the first block structure in the second direction;
   a first block separation region separating the first block structure and the second block structure from each other; and
   a second block separation region separating the second block structure and the third block structure from each other,
   wherein the first block separation region is spaced apart from the second block separation region.

3. The 3D semiconductor memory device of claim 1, further comprising:
   a second block structure spaced apart from the first block structure in the second direction,
   wherein the second block structure is symmetrical with the first block structure or has a shape in which the first block structure is rotated 180 degrees in a plan view.

4. The 3D semiconductor memory device of claim 3, wherein an end sidewall of the first block structure is aligned with an end sidewall of the second block structure on the first connection region when viewed in a plan view, and
   wherein another end sidewall of the first block structure is aligned with another end sidewall of the second block structure on the second connection region when viewed in a plan view.

5. The 3D semiconductor memory device of claim 1, further comprising:
   a second block structure spaced apart from the first block structure in the second direction,
   wherein the second block structure has the first width on the cell array region,
   wherein the second block structure has the third width on the first connection region, and
   wherein the second block structure has the second width on the second connection region.

6. The 3D semiconductor memory device of claim 1, wherein a sum of the second width and the third width corresponds to twice the first width.

7. The 3D semiconductor memory device of claim 1, wherein the first block structure comprises:
   a lower stack structure comprising a plurality of lower electrodes vertically stacked on the substrate; and
   intermediate stack structures comprising a plurality of intermediate electrodes vertically stacked on the lower stack structure, wherein the intermediate stack structures expose the lower stack structure,
   wherein the intermediate stack structures are offset from each other in the first direction.

8. The 3D semiconductor memory device of claim 7, wherein the intermediate electrodes in each of the intermediate stack structures include sidewalls exposed in the first direction and vertically aligned with each other.

9. The 3D semiconductor memory device of claim 7, wherein the first block structure further comprises: an upper stack structure on a plurality of the intermediate stack structures,
   wherein the upper stack structure comprises: n upper electrodes spaced apart from each other in the second direction and at the same height,
   wherein end portions of the intermediate electrodes constituting one of the intermediate stack structures form a staircase structure in the second direction, and
   wherein the number of the intermediate electrodes forming the staircase structure is greater than n and is less than 2n.

10. The 3D semiconductor memory device of claim 7, wherein the lower electrodes constituting the lower stack structure form a staircase shape on the first connection region,
    wherein a lowermost lower electrode of the lower electrodes is exposed on both the first connection region and the second connection region,
    the 3D semiconductor memory device further comprising:
    a first contact plug being in contact with the lowermost lower electrode on the first connection region; and
    a second contact plug being in contact with the lowermost lower electrode on the second connection region.

11. The 3D semiconductor memory device of claim 7, further comprising:
    a dummy stack structure on the intermediate stack structure on the first connection region, wherein the dummy stack structure comprises vertically stacked dummy electrodes, and wherein the dummy electrodes form a staircase structure.

12. The 3D semiconductor memory device of claim 1, wherein the first block structure comprises: a first lower electrode at a lowermost position,
    wherein the first lower electrode on the first connection region comprises: a first electrode portion adjacent to the cell array region; a second electrode portion spaced apart from the first electrode portion; and a third electrode portion connecting the first electrode portion and the second electrode portion, and wherein the first electrode portion has the first width, and the second electrode portion has the second width.

13. The 3D semiconductor memory device of claim 12, wherein a sidewall of the third electrode portion has a diagonal profile or a staircase-shaped profile when viewed in a plan view.

14. The 3D semiconductor memory device of claim 1, wherein the first block structure has a first length parallel to the first direction on the first connection region,
wherein the first block structure has a second length parallel to the first direction on the second connection region, and
wherein the first length is equal to the second length.

15. A three-dimensional (3D) semiconductor memory device comprising:
a first block structure, a second block structure and a third block structure, on a substrate and are spaced apart from each other in a first direction;
a first block separation region separating the first block structure and the second block structure from each other; and
a second block separation region separating the second block structure and the third block structure from each other,
wherein the first block separation region is spaced apart from the second block separation region, and
wherein at least one of the first block separation region or the second block separation region has a staircase shape when viewed in a plan view.

16. The 3D semiconductor memory device of claim 15, wherein the substrate includes: a first connection region and a second connection region arranged in a second direction intersecting the first direction; and a cell array region between the first and second connection regions,
wherein the second block structure has a first width on the cell array region,
wherein the second block structure has a second width on the first connection region,
wherein the second block structure has a third width on the second connection region,
wherein the first width, the second width and the third width are parallel to the first direction, and
wherein the first width is less than the second width and is greater than the third width.

17. The 3D semiconductor memory device of claim 15, wherein the first block structure or the third block structure is symmetrical with the second block structure or has a shape in which the second block structure is rotated 180 degrees in a plan view.

18. A three-dimensional (3D) semiconductor memory device comprising:
a substrate including a first connection region and a second connection region in a first direction and a cell array region between the first and second connection regions; and
a first block structure disposed on the substrate,
wherein the first block structure comprises: first lower electrodes at a lowermost position; and first upper electrodes at an uppermost position,
wherein the first upper electrodes are spaced apart from each other in a second direction intersecting the first direction and have line shapes extending in the first direction,
wherein each of the first upper electrodes has a first width parallel to the second direction,
wherein the first lower electrodes are spaced apart from each other in the second direction intersecting the first direction,
wherein each of the first lower electrode includes a protrusion laterally protruding from a sidewall of an outermost one of the first upper electrodes on one of the first and second connection regions,
wherein each of the protrusions have a second width parallel to the second direction, and
wherein the second width ranges from one to three times the first width, the second width of each of the protrusions decreasing from a lowermost first lower electrode to an uppermost first lower electrode.

19. The 3D semiconductor memory device of claim 18, wherein the first block structure has a third width on the cell array region,
wherein the first block structure has a fourth width on the one of the first and second connection regions,
wherein the first block structure has a fifth width on the other of the first and second connection regions,
wherein the third width, the fourth width and the fifth width are parallel to the second direction, and
wherein the third width is greater than the fifth width and is less than the fourth width.

20. The 3D semiconductor memory device of claim 18, wherein the first lower electrode is exposed on both the first connection region and the second connection region, the 3D semiconductor memory device further comprising:
a first contact plug being in contact with the first lower electrode on the first connection region; and
a second contact plug being in contact with the first lower electrode on the second connection region.

* * * * *